(12) United States Patent
Yun et al.

(10) Patent No.: US 7,491,484 B2
(45) Date of Patent: Feb. 17, 2009

(54) PHOTORESIST COMPOSITIONS AND METHODS OF FORMING A PATTERN USING THE SAME

(75) Inventors: Hyo-Jin Yun, Anyang-si (KR); Young-Gil Kwon, Yongin-si (KR); Do-Young Kim, Gwanak-gu (KR); Jae-Ho Kim, Yongin-si (KR); Young-Ho Kim, Yongin-si (KR); Boo-Deuk Kim, Yeongtong-gu (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/869,933

(22) Filed: Oct. 10, 2007

(65) Prior Publication Data

US 2008/0160448 A1 Jul. 3, 2008

(30) Foreign Application Priority Data

Oct. 11, 2006 (KR) ............... 10-2006-0099014

(51) Int. Cl.
*G03F 7/004* (2006.01)
*G03F 7/30* (2006.01)

(52) U.S. Cl. ............... 430/270.1; 430/326; 430/910; 430/921; 430/922

(58) Field of Classification Search ............ 430/270.1, 430/326, 910, 921, 922
See application file for complete search history.

(56) References Cited

U.S. PATENT DOCUMENTS

| 7,262,321 | B2 * | 8/2007 | Harada et al. ............ 560/129 |
| 2006/0147836 | A1 * | 7/2006 | Hatakeyama et al. .... 430/270.1 |
| 2006/0234160 | A1 * | 10/2006 | Hasegawa et al. ........ 430/270.1 |
| 2007/0027336 | A1 * | 2/2007 | Yoshida et al. ............ 560/129 |
| 2007/0141512 | A1 * | 6/2007 | Wada et al. ............ 430/270.1 |

FOREIGN PATENT DOCUMENTS

| JP | 2005-173549 | 6/2005 |
| JP | 2005-266799 | 9/2005 |
| JP | 2005-309407 | 11/2005 |

\* cited by examiner

*Primary Examiner*—John S Chu
(74) *Attorney, Agent, or Firm*—Volentine & Whitt, PLLC

(57) ABSTRACT

In a photoresist composition and a method of forming a pattern using the same, the photoresist composition includes about 0.1 to about 0.5 percent by weight of a photoacid generator including a positively charged sulfonium ion and a negatively charged sulfonate ion having a hydrophilic carboxylic group, about 4 to about 10 percent by weight of a resin, and a solvent.

15 Claims, 4 Drawing Sheets

PHOTORESIST COMPOSITIONS AND METHODS OF FORMING A PATTERN USING THE SAME

CROSS-REFERENCE TO RELATED APPLICATIONS

A claim of priority under 35 U.S.C. § 119 is made to Korean Patent Application No. 2006-99014, filed Oct. 11, 2006, the contents of which are herein incorporated by reference in their entirety.

BACKGROUND OF THE INVENTION

1. Field of the Invention

Example embodiments of the present invention relate to photoresist compositions and to methods of forming a pattern using the same. More particularly, example embodiments of the present invention relate to photoresist compositions that may be used in the formation of a pattern in a semiconductor manufacturing process and to methods of forming a pattern using the same.

2. Description of the Related Art

In order to fabricate highly integrated semiconductor devices having high operational speeds, it has become necessary to form very fine patterns having line widths below about 100 nm. Conventionally, patterns are formed using a photolithography process which generally includes a photoresist coating process, an alignment process, an exposure process and/or a developing process.

The photoresist has a molecular structure that may be changed by light irradiated thereto, and a photoresist film is formed by coating a substrate including such a photoresist. A photomask on which an electronic circuit pattern is formed is arranged over the substrate where the photoresist film is formed by the alignment process. Then, an illuminating light having a particular wavelength is provided to the photoresist film so as to generate a photochemical reaction in an exposed portion of the photoresist film. Accordingly, a predetermined electronic circuit pattern may be transcribed onto the photoresist film by the alignment and exposure processes. The exposed portion of the photoresist film, which corresponds to the predetermined electronic circuit pattern, has an altered molecular structure. The photoresist film having the altered molecular structures is selectively removed by the developing process to thereby form a photoresist pattern on the substrate.

While the developing process is performed, the exposed portion of the photoresist film may be selectively removed from the substrate, or may selectively remain on the substrate. As a result, a photoresist pattern having a shape corresponding to that of the predetermined electronic circuit pattern is formed on the substrate. A minimal line width of the photoresist pattern is determined in accordance with a resolution of an exposing system. The resolution of the exposing system is determined by a wavelength of an illuminating light according to Rayleigh's equation as follows:

$$R = k_1 \lambda / NA$$

In Rayleigh's equation, $\lambda$ denotes a wavelength of the illuminating light of an exposing system, R denotes a resolution limit of an exposing system, $k_1$ denotes a proportional constant of an exposing process, and NA denotes a numerical aperture of a lens of an exposing process. According to Rayleigh's equation, the wavelength $\lambda$ of the illuminating light and the proportional constant $k_1$ need to be as small as possible, and the numerical aperture of a lens needs to be as large as possible for decreasing the resolution limit of an exposing system. As the wavelength of the illuminating light becomes shorter, the resolution of the exposing system is improved and a line width of a photoresist pattern is reduced. Thus, the wavelength of the illuminating light, the exposing system and a resolution limit of a photoresist are essentially considered to form a fine photoresist pattern.

A photoresist is generally classified as either a negative photoresist or a positive photoresist. In an exposed portion of the positive photoresist, a blocking group of a photosensitive polymer is detached by an acid that is generated from a photoacid generator. The photosensitive polymer, from which the blocking group is removed, may be readily dissolved into a developing solution during the developing process.

A photoresist, which has been conventionally used for forming a pattern having a line width below about 75 nm, has a process margin that is insufficient for forming isolated and dense patterns. Accordingly, sparse patterns formed in a peripheral region have a critical dimension which is substantially different from that of dense patterns formed in a cell region. To overcome the difference in the critical dimension between the cell region and the peripheral region, a method of increasing an amount of a photoacid generator has been developed. When the amount of the photoacid generator increases, the above-mentioned problem may be solved, but a top portion of a pattern may be rounded or a damaged pattern may be formed.

Additionally, the photoacid generator having a hydrophobic property that poorly interacts with a hydrophilic resin in a photoresist composition, and thus the photoacid generator may not be uniformly distributed in a photoresist film.

FIG. 1 is a conceptional view illustrating a distribution of photoacid generators in a photoresist film formed using a conventional photoresist composition.

As illustrated in FIG. 1, the photoacid generators 14 poorly interacting with a resin 12 are not positioned adjacent to the resin 12, and are aggregated in a top portion of the photoresist film 10 formed on a substrate 5. Accordingly, a diffusion length of an acid generated in an exposure process and a baking process may become greater, and thus a photoresist pattern having a uniform profile may not be formed.

SUMMARY OF THE INVENTION

According to one aspect of the present invention, a photoresist composition is provided which includes about 0.1 to about 0.5 percent by weight of a photoacid generator, about 4 to about 10 percent by weight of a resin, and a solvent. The photoacid generator includes a sulfonium ion represented by Formula 1 and a sulfonate ion represented by Formula 2.

Formula 1

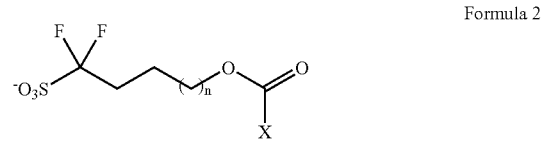

Formula 2

In Formulae 1 and 2, $R_1$, $R_2$ and $R_3$ are independently any one of an aryl group and a cycloalkyl group, n is an integer in a range of 1 to 3 inclusive, and X is any one of a $C_4$ to $C_8$ cycloalkyl group, an adamantyl group and a cyclic ester moiety.

According to another aspect of the present invention, a method of forming a pattern on a substrate is provided. The method includes forming a photoresist film on a layer positioned on the substrate by coating the layer with a photoresist composition including about 0.1 to about 0.5 percent by weight of a photoacid generator including a sulfonium ion represented by Formula 1 above and a sulfonate ion represented by Formula 2 above, about 4 to about 10 percent by weight of a resin, and a solvent. The method further includes exposing the photoresist film to light in an exposure process, developing the photoresist film using a developing solution to form a photoresist pattern on the layer, and etching the layer using the photoresist pattern as an etching mask to form the pattern on the substrate.

BRIEF DESCRIPTION OF THE DRAWINGS

The above and other features and advantages of the present invention will become readily apparent from the detailed description that follows, with reference to the accompanying drawings, in which.

DESCRIPTION OF THE INVENTION

Figure 1:
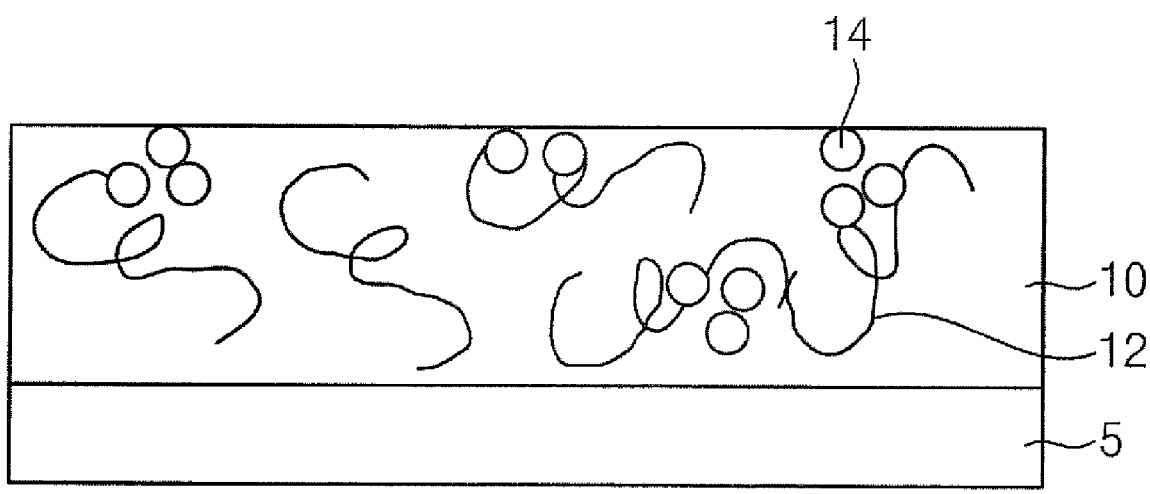
FIG. 1 is a conceptional view illustrating a distribution of a photoacid generator in a photoresist film formed using a conventional photoresist composition.

The present invention is described more fully hereinafter with reference to the accompanying drawings, in which example embodiments of the present invention are shown. The present invention may, however, be embodied in many different forms and should not be construed as limited to the example embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms including technical and scientific terms used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Photoacid Generator

A photoresist composition according to the present invention includes a hydrophilic photoacid generator. The photoacid generator includes a sulfonium ion as a cation and a sulfonate ion as an anion.

The sulfonium ion included in the photoacid generator is represented by Formula 1.

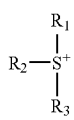

Formula 1

In Formula 1, $R_1$, $R_2$ and $R_3$ may independently denote a hydroxyl group, an aryl group or a cycloalkyl group. The aryl group may be an unsubstituted aryl group or a substituted aryl group. Non-limiting examples of the aryl group may include a phenyl group, a tolyl group, a naphthyl group, an anthryl group, an alkyl-substituted aryl group, a hydroxyl-substituted aryl group, and a cycloalkyl-substituted aryl group. For example, $R_1$, $R_2$ and $R_3$ may independently be a phenyl group, a tolyl group, or a naphthyl group.

Non-limiting examples of the sulfonium ion represented by Formula 1 may include a diphenyl sulfonium salt and a triphenyl sulfonium salt.

The sulfonate ion included in the photoacid generator is represented by Formula 2.

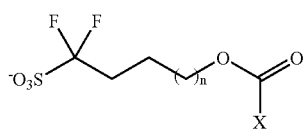

Formula 2

In Formula 2, n is an integer in a range of 1 to 3 inclusive, and X is any one of a $C_4$ to $C_8$ cycloalkyl group, an alkyl group, an adamantyl group and a cyclic ester moiety. For example, X may be an adamantyl group or a moiety of 4,7,7-trimethyl-2-oxa-bicyclo[2,2,1]heptan-3-one.

The photoacid generator including the sulfonate ion may be activated by light in an exposure process to produce sulfonic acid represented by Formula 3.

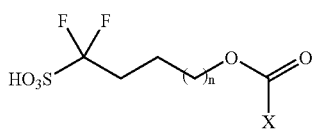

Formula 3

In Formula 3, n is an integer in a range of 1 to 3 inclusive, and X is any one of a $C_4$ to $C_8$ cycloalkyl group, an alkyl group, an adamantyl group and a cyclic ester moiety.

In an example embodiment of the present invention, the sulfonate ion may be represented by Formula 2-1.

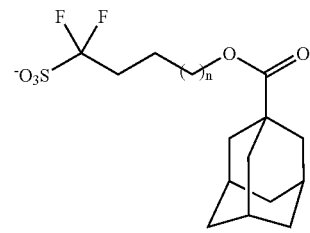

Formula 2-1

In Formula 2-1, n is an integer of 1 to 3 inclusive. When the sulfonate ion is represented by Formula 2-1, the photoacid generator may be represented by Formula 4-1.

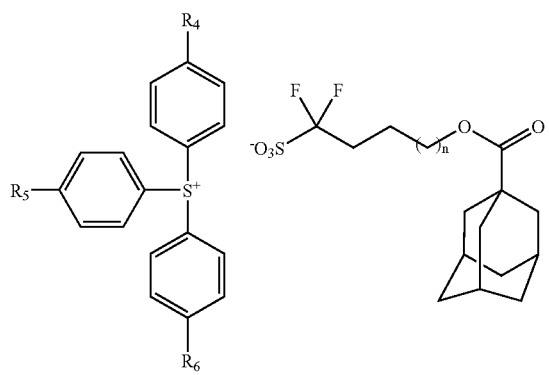

Formula 4-1

In Formula 4-1, $R_4$, $R_5$ and $R_6$ independently denote a hydrogen atom, a $C_1$ to $C_5$ alkyl group, a hydroxyl group or a cycloalkyl group, and n is an integer of 1 to 3 inclusive. When the photoacid generator represented by Formula 4-1 is exposed to light, the photoacid generator may produce sulfonic acid represented by Formula 3-1.

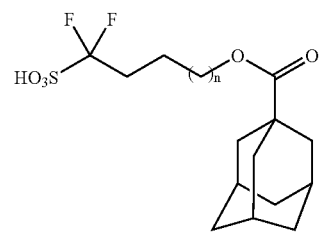

Formula 3-1

In an example embodiment of the present invention, when X in Formula 2 is a moiety of 4,7,7-trimethyl-2-oxa-bicyclo[2,2,1]heptan-3-one, the sulfonate ion is represented by Formula 2-2.

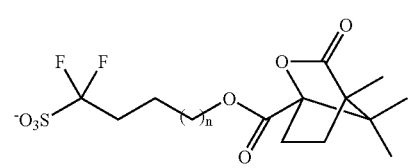

Formula 2-2

In Formula 2-2, n is an integer of 1 to 3 inclusive. When the sulfonate ion is represented by Formula 2-2, the photoacid generator may be represented by Formula 4-2.

Formula 4-2

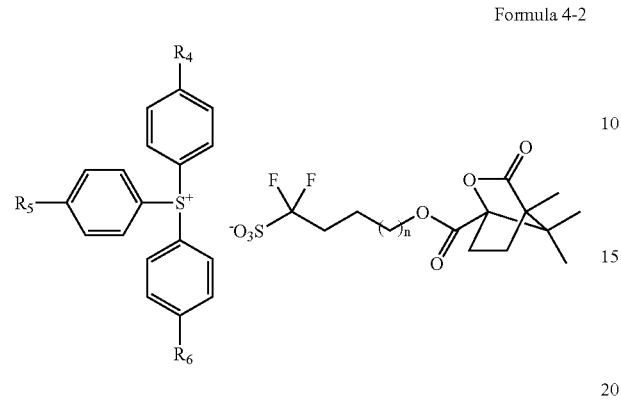

In Formula 4-2, $R_4$, $R_5$ and $R_6$ are independently any one of a hydrogen atom, a $C_1$ to $C_5$ alkyl group, a hydroxyl group and a cycloalkyl group, and n is an integer of 1 to 3 inclusive. When the photoacid generator represented by Formula 4-2 is exposed to light, the photoacid generator may produce sulfonic acid represented by Formula 3-2.

Formula 3-2

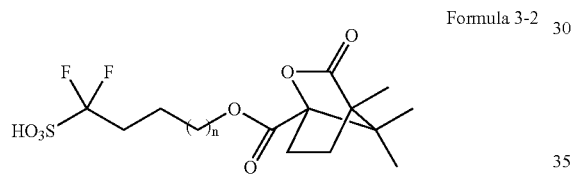

The photoacid generator includes a hydrophobic fluorine atom in its molecule, whereas the photoacid generator also includes a hydrophilic carboxylic acid. Thus, the photoacid generator has a hydrophilic property. When a photoresist film is formed using a photoresist composition that includes the photoacid generator, molecules of the photoacid generator may be uniformly distributed among hydrophilic resins included in the photoresist film.

Photoresist Composition

A photoresist composition according to the present invention includes a resin that may be reacted with an acid generated from a photoacid generator, a photoacid generator having a hydrophilic property, and solvent.

The resin included in the photoresist composition may be reacted with an acid and then a solubility of the resin with respect to a basic developing solution may be enhanced. The resin includes a blocking group in a main chain and/or a side chain thereof. The blocking group is an acid-labile group that may be readily detached from the resin by the acid.

The blocking group may be combined with the resin in place of a hydrogen atom of a carboxylic group or a hydroxyl group of the resin, and may be readily separated from a chain of the resin by an acid. Non-limiting examples of the blocking group may include a lactone-based group, an adamantly group, and a cycloalkyl group.

In example embodiments of the present invention, the resin may have a repeating unit of acrylate or methacrylate that includes the above-mentioned blocking group. For example, the resin may have a repeating unit of methacrylate that includes a lactone-based blocking group and/or an adamantly blocking group.

In example embodiments of the present invention, the resin may have a repeating unit including a lactone-based blocking group represented by the following formulae:

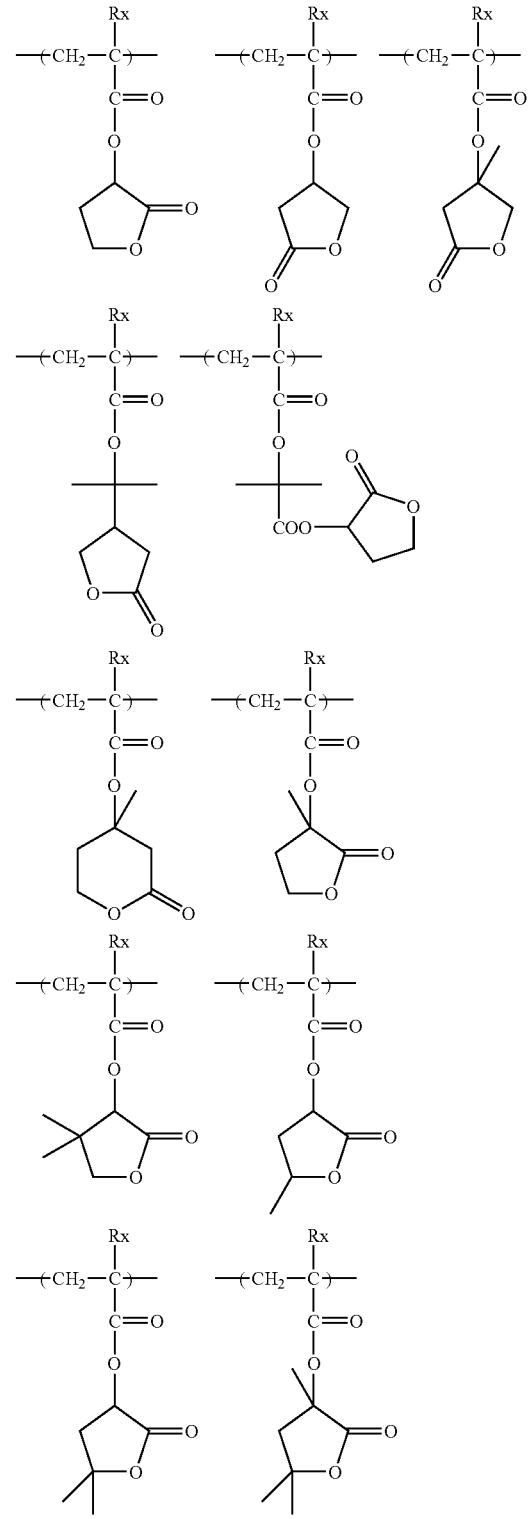

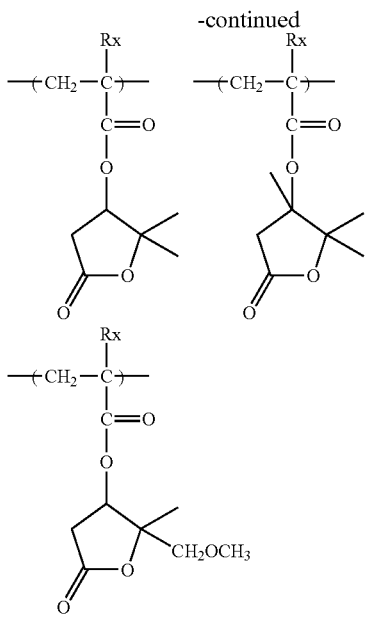

In the formulae, Rx represents a hydrogen atom or a methyl group.

In example embodiments of the present invention, the resin may have a repeating unit including an adamantyl blocking group represented by the following formula:

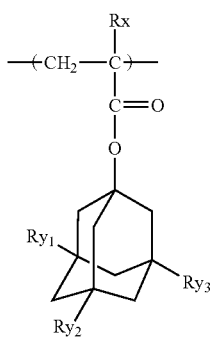

In the formula, Rx represents a hydrogen atom or a methyl group, and $Ry_1$, $Ry_2$ and $Ry_3$ independently denote a hydrogen atom or a hydroxyl group.

In example embodiments of the present invention, the resin may have a first repeating unit of methacrylate including a first adamantyl blocking group, a second repeating unit of methacrylate including a lactone-based blocking group, and a third repeating unit of methacrylate including a second adamantyl blocking group. The first adamantyl blocking group has a molecular weight substantially larger than that of the second adamantyl blocking group.

When the amount of the resin included in the photoresist composition is less than about 4 percent by weight, a photoresist pattern may have a poor etching resistance. Additionally, when the amount of the resin is greater than about 10 percent by weight, a photoresist film having a uniform thickness may not be obtained. Thus, the photoresist composition may include the resin in a range of about 4 to about 10 percent by weight.

The photoacid generator included in the photoresist composition includes a sulfonium ion represented by Formula 1 and a hydrophilic sulfonate ion represented by Formula 2.

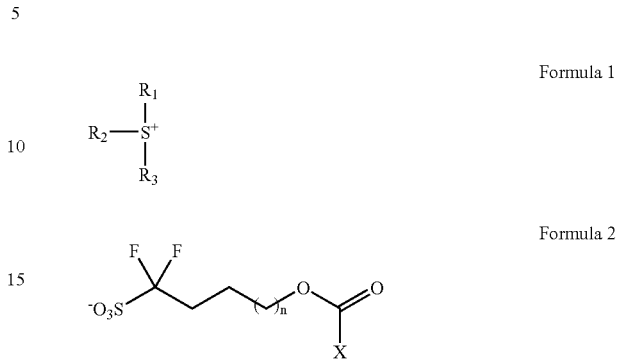

In Formula 1, $R_1$, $R_2$ and $R_3$ may independently denote a hydroxyl group, an aryl group or a cycloalkyl group. The aryl group may be an unsubstituted aryl group or a substituted aryl group. Non-limiting examples of the aryl group may include a phenyl group, a tolyl group, a naphthyl group, an anthryl group, an alkyl-substituted aryl group, a hydroxyl-substituted aryl group, and a cycloalkyl-substituted aryl group. For example, $R_1$, $R_2$ and $R_3$ may independently be a phenyl group, a tolyl group, a naphthyl group, etc. Non-limiting examples of the sulfonium ion represented by Formula 1 may include a diphenyl sulfonium salt and a triphenyl sulfonium salt.

In Formula 2, n is an integer in a range of 1 to 3 inclusive, and X is any one of a $C_4$ to $C_8$ cycloalkyl group, an alkyl group, an adamantyl group and a cyclic ester moiety. For example, X may be an adamantyl group or a moiety of 4,7,7-trimethyl-2-oxa-bicyclo[2,2,1]heptan-3-one.

In example embodiments of the present invention, the photoacid generator may be represented by Formula 4-1.

Formula 4-1

In Formula 4-1, $R_4$, $R_5$ and $R_6$ independently denote a hydrogen atom, a $C_1$ to $C_5$ alkyl group, a hydroxyl group or a cycloalkyl group, and n is an integer of 1 to 3 inclusive. When the photoacid generator represented by Formula 4-1 is exposed to light, the photoacid generator may produce sulfonic acid represented by Formula 3-1.

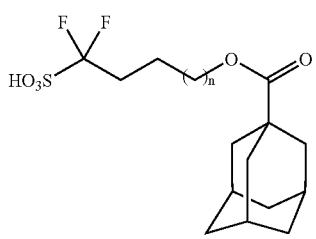

Formula 3-1

In example embodiments of the present invention, the photoacid generator may be represented by Formula 4-2.

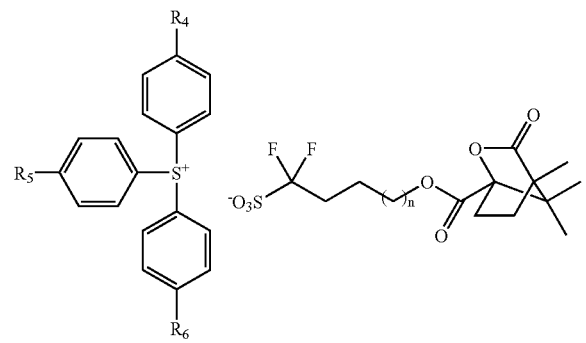

Formula 4-2

In Formula 4-2, $R_4$, $R_5$ and $R_6$ are independently a hydrogen atom, a $C_1$ to $C_5$ alkyl group, a hydroxyl group or a cycloalkyl group, and n is an integer of 1 to 3 inclusive. When the photoacid generator represented by Formula 4-2 is exposed to light, the photoacid generator may produce sulfonic acid represented by Formula 3-2.

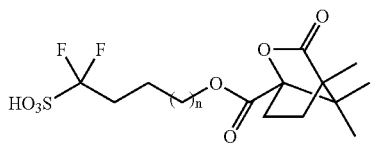

Formula 3-2

The photoacid generator may have an improved hydrophilic property, and thus the photoacid generator may closely interact with the resin having hydrophilicity. Accordingly, when a photoresist film is formed using the photoresist composition that includes the photoacid generator, molecules of the photoacid generator may be uniformly distributed among hydrophilic resins in the photoresist film. The photoacid generator is previously described, so any further explanations in this regard will be omitted herein to avoid redundancy.

When the amount of the photoacid generator is less than about 0.1 percent by weight, less acid may be generated during an exposure process, and the blocking group may not be sufficiently detached from the resin. Additionally, when the amount of the photoacid generator is greater than about 0.5 percent by weight, the acid may be excessively generated so that an increased amount of a top portion of a photoresist pattern may be removed during a developing process. Therefore, the photoresist composition may include the photoacid generator in a range of about 0.1 to about 0.5 percent by weight, and preferably in a range of about 0.15 to about 0.4 percent by weight.

Non-limiting examples of the solvent may include ethylene glycol monomethyl ether, ethylene glycol monomethyl ether, propylene glycol methyl ether, methyl cellosolve acetate, ethyl cellosolve acetate, diethylene glycol monomethyl ether, diethylene glycol monoethyl ether, propylene glycol methyl ether acetate, propylene glycol propyl ether acetate, diethylene glycol dimethyl ether, ethyl lactate, toluene, xylene, methyl ethyl ketone, cyclohexanone, 2-heptanone, 3-heptanone, and 4-heptanone. These can be used alone or in a mixture of two or more thereof.

The amount of the solvent may be properly adjusted in accordance with types and amounts of the photoacid generator and the resin included in the photoresist composition.

In some example embodiments of the present invention, the photoresist composition may include an additive. Non-limiting examples of the additive may include an organic base and a surfactant. The organic base may prevent a basic compound such as an amine in the air from influencing a photoresist pattern obtained after performing an exposure process. The organic base may also maintain or adjust a shape of the photoresist pattern.

Non-limiting examples of the organic base, which may be used in the photoresist composition, may include triethylamine, triisobutylamine, triisooctylamine, triisodecylamine, diethanolamine, and triethanolamine. These can be used alone or in a mixture of two or more thereof.

The surfactant may improve a coatability of the photoresist composition, yet inhibit a striation on a photoresist film formed using the photoresist composition. Non-limiting examples of the surfactant, which may be used in the photoresist composition, may include fluorine-containing surfactants such as SURFLON SC-103, SR-100 (trade names manufactured by Asahi Glass Co., Ltd.), EF-361 (a trade name manufactured by Tohoku Hiryou K.K.), FLORAD Fc-431, Fc-135, Fc-98 and Fc-176 (trade names manufactured by Sumitomo 3M Ltd.).

Method of Forming a Pattern

FIGS. 2 to 5 are cross-sectional views for use in explaining a method of forming a pattern in accordance with example embodiments of the present invention.

Figure 2:
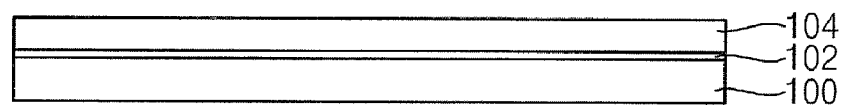
FIGS. 2 to 5 are cross-sectional views illustrating a method of forming a pattern in accordance with example embodiments of the present invention.

Referring to FIG. 2, an object to be etched is prepared. Non-limiting examples of the object may include a semiconductor substrate and a thin film 102 formed on a substrate 100. Non-limiting examples of the thin film 102 may include a silicon nitride layer, a polysilicon layer, and a silicon oxide layer.

The substrate 100 including the thin film 102 may be cleaned so as to remove any remaining contaminants from the thin film 102. A photoresist film 104 is formed on the thin film 102 by coating the thin film 102 with a photoresist composition including a photoacid generator having a hydrophilic portion, a resin and solvent.

The photoacid generator included in the photoresist composition includes a sulfonium ion represented by Formula 1 and a hydrophilic sulfonate ion represented by Formula 2.

Formula 1

-continued

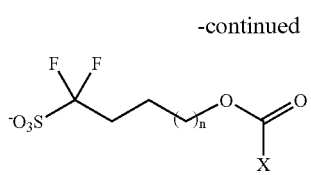

Formula 2

The photoacid generator and the photoresist composition are previously described so any further explanations in these regards will be omitted here to avoid redundancy.

In example embodiments of the present invention, the substrate 100 on which the photoresist film 104 is formed may be thermally treated in a first baking process. The first baking process may be performed, for example, at a temperature of about 90° C. to about 120° C. In the first baking process, an adhesiveness property between the photoresist film 104 and the thin film 102 may be enhanced.

Figure 3:
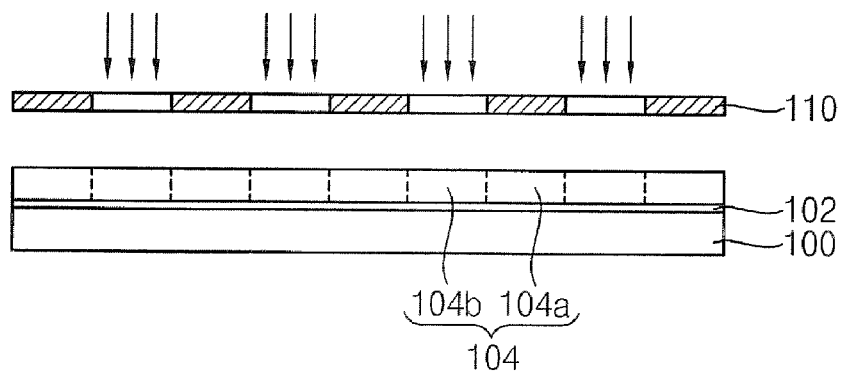

Referring to FIG. 3, the photoresist film 104 is partially exposed to light in an exposure process. In example embodiments of the present invention, a mask 110 having a predetermined pattern may be positioned on a mask stage of an exposure apparatus, and then the mask 110 is aligned over the photoresist film 104. A portion of the photoresist film 104 formed on the substrate 100 may be selectively reacted with light transmitted through the mask 110 while the light is irradiated on the mask 110 for a predetermined time period.

Non-limiting examples of the light that may be used in the exposure process may include an ArF laser having a wavelength of about 193 nm, a KrF laser having a wavelength of about 248 nm, an $F_2$ laser, and an Hg—Xe light. An exposed portion 104b of the photoresist film 104 may be more hydrophilic than an unexposed portion 104a of the photoresist film 104. Accordingly, the exposed portion 104b and the unexposed portion 104a of the photoresist film 104 may have different solubilities from each other.

Subsequently, a second baking process may be performed on the substrate 100. The second baking process may be performed, for example, at a temperature of about 90° C. to about 150° C. In the second baking process, the exposed portion 104b of the photoresist film 104 may become soluble in a developing solution.

Figure 4:

Referring to FIG. 4, a photoresist pattern 106 is formed by dissolving the exposed portion 104b of the photoresist film 104 into a developing solution and then removing the exposed portion 104b from the photoresist film 104.

Particularly, the exposed portion 104b of the photoresist film 104 may be removed by dissolving the exposed portion 104b into an aqueous solution of tetramethylammonium hydroxide. The hydrophilicities in the unexposed and the exposed portions 104a and 104b of the photoresist film 104 are different from each other, and thus the exposed portion 104b of the photoresist film 104 may be selectively removed by being dissolved in the developing solution. Subsequently, the substrate 100 having the photoresist pattern 106 may be rinsed and dried to complete the photoresist pattern 106.

Thus, the obtained photoresist pattern 106 may have an enhanced profile, because molecules of the photoacid generator may be uniformly distributed in the photoresist film 104 and a diffusion length of an acid may be shortened. Additionally, the photoresist pattern 106 having a predetermined shape, diameter and/or width may be formed without generating defects.

Figure 5:
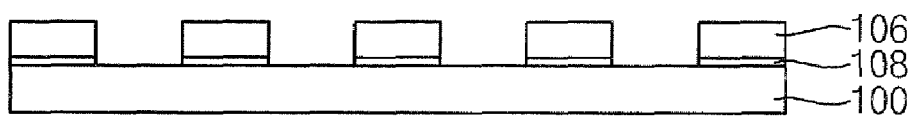

Referring to FIG. 5, the thin film 102 is partially etched using the photoresist pattern 106 as an etching mask to form a thin film pattern 108 on the substrate 100.

The present invention will be described below in more detail with reference to non-limiting examples of preparing a photoacid generator and a photoresist composition having the photoacid generator. However, it will be understood that the present invention is not limited by the following non-limiting examples.

Synthesis of a Photoacid Generator

Synthesis Example 1

After 4-bromo-4,4-difluorobutanol was reacted with adamantane carbonyl chloride, a product of the reaction was sulfonated. A photoacid generator represented by Formula 4-1' was obtained by reacting a sulfonated product with triphenylsulfonium chloride.

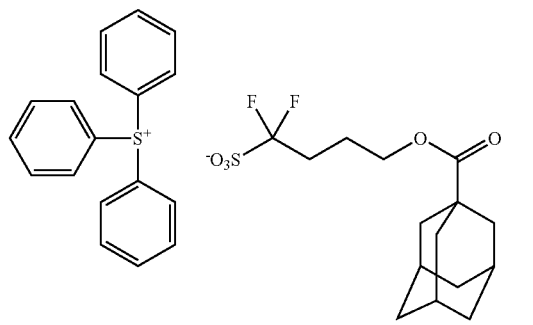

Formula 4-1'

Synthesis Example 2

After 4-bromo-4,4-difluorobutanol was reacted with 4,7,7-trimethyl-3-oxo-2-oxa-bicyclo[2.2.1]heptane-1-carbonyl chloride, a product of the reaction was sulfonated. A photoacid generator represented by Formula 4-2' was obtained by reacting a sulfonated product with triphenylsulfonium chloride.

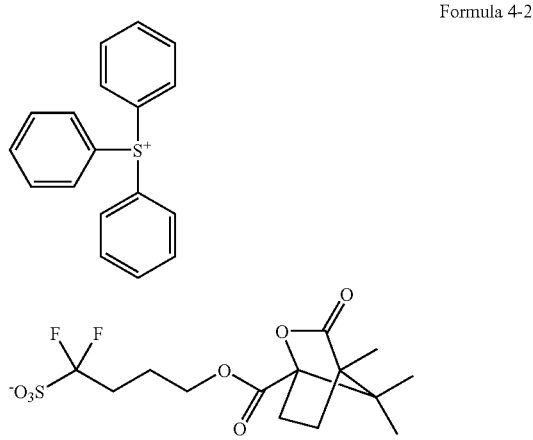

Formula 4-2'

Preparation of a Photoresist Composition

EXAMPLE 1

About 2 parts by weight of the photoacid generator prepared in Synthesis Example 1 and about 111 parts by weight of methacrylate resin were dissolved in about 887 parts by weight of propylene glycol monomethyl ether acetate, and then the obtained mixture was filtered using a membrane film having a pore diameter of about 0.2 μm. As a result, a photoresist composition was obtained

EXAMPLE 2

A photoresist composition was prepared by performing processes substantially the same as those in Example 1 except that the photoacid generator obtained in Synthesis Example 2 was used instead of the photoacid generator prepared in Synthesis Example 1.

COMPARATIVE EXAMPLE 1

A photoresist composition was prepared by performing processes substantially the same as those in Example 1 except that a photoacid generator represented by Formula 5 was used instead of the photoacid generator prepared in Synthesis Example 1.

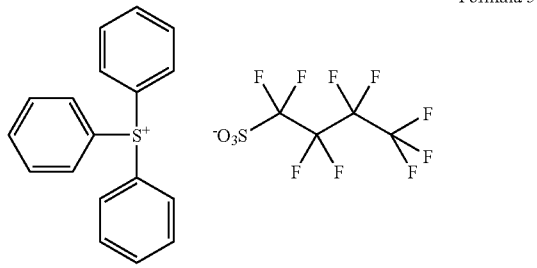

Formula 5

Evaluation of a Contact Angle of a Photoresist Film

Photoresist films were formed using the photoresist compositions prepared in Examples 1 and 2 and Comparative Example 1. Particularly, the photoresist films were formed by coating silicon wafers with the photoresist compositions and then by thermally treating the silicon wafers at a temperature of about 100° C. for about 90 seconds.

To evaluate the distribution of the photoacid generator in the photoresist film, water was dropped on the photoresist film and then a contact angle of a waterdrop relative to the photoresist film was measured. The distribution of the photoacid generator may be indirectly confirmed from the contact angle of a waterdrop. The results are shown in Table 1.

TABLE 1

|  | Example 1 | Example 2 | Comparative Example 1 |
| --- | --- | --- | --- |
| Contact Angle [°] | 68 | 67 | 75 |

As illustrated in Table 1, contact angles of the photoresist films formed using the photoresist compositions prepared in Examples 1 and 2 were below about 70°, whereas a contact angle of the photoresist film formed using the photoresist composition prepared in Comparative Example 1 was about 75°.

It may be noted that the contact angle of the waterdrop may be changed in accordance with a type of the photoacid generator included in the photoresist film. An increase in the contact angle of the waterdrop means that the photoacid generator may have a high level of hydrophobicity, and molecules of the photoacid generator may be mainly distributed in a top portion of the photoresist film. Thus, it may be confirmed that molecules of the photoacid generators may be uniformly distributed in the photoresist films formed using the photoresist composition according to Examples 1 and 2, from a low level of the contact angles.

Evaluation of a Photoresist Pattern

Photoresist films were formed on silicon wafers by coating the silicon wafers with the photoresist compositions prepared in Example 1 and Comparative Example 1, and then by thermally treating the silicon wafers at a temperature of about 100° C. for about 90 seconds. The photoresist films were selectively exposed to an Hg—Xe light using a photomask and were thermally treated at a temperature of about 110° C. for about 90 seconds. Exposed portions of the photoresist films were removed from the silicon wafers using about 2.38 percent by weight of tetramethylammonium hydroxide (TMAH) solution as a developing solution. A cleaning process and a drying process were performed on the silicon wafers to form photoresist patterns on the silicon wafers. The photoresist patterns were observed using a scanning electron microscope (SEM). The photomask had a pattern image in which patterns were disposed apart from patterns by a distance of about 100 nm in a lengthwise direction of the pattern.

Figure 6:
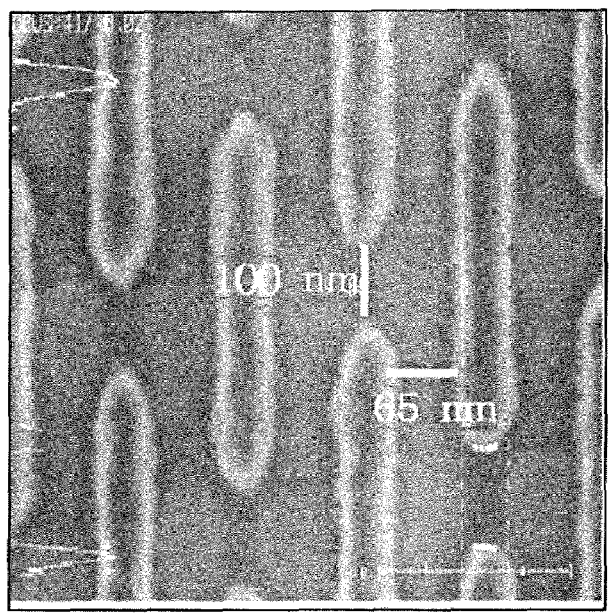
FIG. 6 is a scanning electron microscopic (SEM) picture showing a photoresist pattern formed using a photoresist composition prepared in Example 1.

FIG. 6 is an SEM image showing the photoresist pattern formed using the photoresist composition prepared in Example 1.

Referring to FIG. 6, photoresist patterns were disposed apart from photoresist patterns by a distance of about 95 nm to about 100 nm in a lengthwise direction. Therefore, it may be noted that a ratio between a length and a width of the photoresist pattern was improved. Additionally, the photoresist pattern formed using the photoresist composition according to Example 1 has an enhanced profile, of which a top portion of the photoresist pattern is neither rounded nor damaged.

Figure 7:
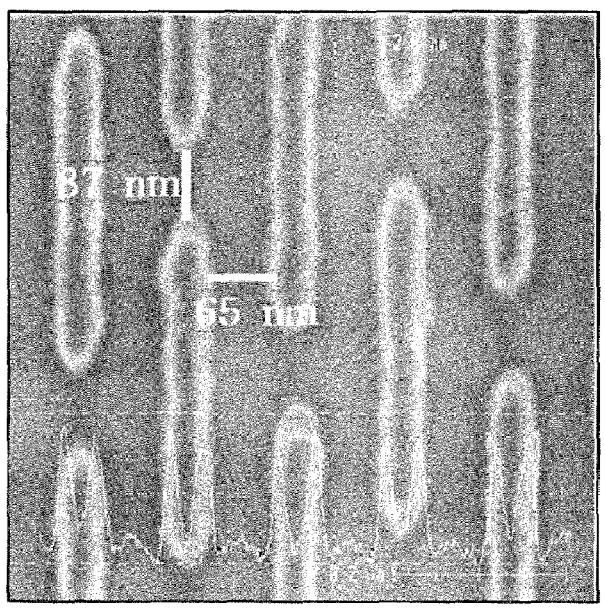
FIG. 7 is an SEM picture showing a photoresist pattern formed using a photoresist composition prepared in Comparative Example 1.

FIG. 7 is an SEM image showing the photoresist pattern formed using the photoresist composition prepared in Comparative Example 1.

Referring to FIG. 7, the photoresist patterns were disposed apart from photoresist patterns by a distance of about 87 nm in a lengthwise direction, although originally, the distance between photoresist patterns was intended to be about 100 nm. Therefore, it may be confirmed that the photoresist composition prepared in Comparative Example 1 may not substantially improve a ratio between a length and a width of the photoresist pattern.

According to the present invention, the photoacid generator having a hydrophilic property may closely interact with a hydrophilic resin in a photoresist film, and thus molecules of the photoacid generator may be uniformly distributed in the photoresist film. Accordingly, a diffusion length of an acid generated from the photoacid generator to reach a blocking group of the hydrophilic resin may be reduced, and a photoresist pattern having a uniform profile may be obtained. Additionally, the photoresist composition including the hydrophilic photoacid generator may have an improved margin of a critical dimension. Thus, the photoresist composition may be used for simultaneously forming dense and isolated patterns, and may also suppress damage to a top portion of the photoresist pattern.

The foregoing is illustrative of the present invention and is not to be construed as limiting thereof. Although a few example embodiments of the present invention have been described, those skilled in the art will readily appreciate that many modifications are possible in the example embodiments without materially departing from the novel teachings and advantages of the present invention. Accordingly, all such modifications are intended to be included within the scope of the present invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A photoresist composition comprising about 0.1 to about 0.5 percent by weight of a photoacid generator, about 4 to about 10 percent by weight of a resin, and a solvent, wherein the photoacid generator includes a sulfonium ion represented by Formula 1 and a sulfonate ion represented by Formula 2,

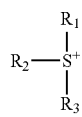

Formula 1

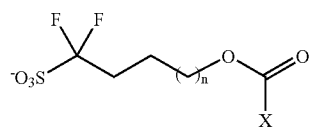

Formula 2 wherein $R_1$, $R_2$ and $R_3$ are independently any one of an aryl group and a cycloalkyl group, n is an integer in a range of 1 to 3 inclusive, and X is any one of a $C_4$ to $C_8$ cycloalkyl group, an adamantyl group and a cyclic ester moiety.

2. The photoresist composition of claim 1, wherein the photoacid generator produces sulfonic acid represented by Formula 3,

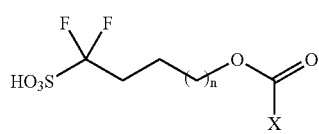

Formula 3 wherein n is an integer in a range of 1 to 3 inclusive, and X is any one of a $C_4$ to $C_8$ cycloalkyl group, an adamantyl group and a cyclic ester moiety.

3. The photoresist composition of claim 1, wherein the photoacid generator is represented by Formula 4-1,

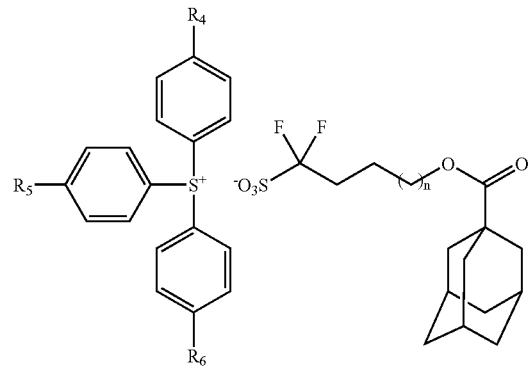

Formula 4-1 wherein $R_4$, $R_5$ and $R_6$ are independently any one of a hydrogen atom and a $C_1$ to $C_5$ alkyl group, a hydroxyl group and a cycloalkyl group, and n is an integer in a range of 1 to 3.

4. The photoresist composition of claim 3, wherein the photoacid generator produces sulfonic acid represented by Formula 3-1,

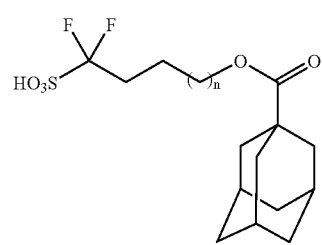

Formula 3-1 wherein n is an integer in a range of 1 to 3.

5. The photoresist composition of claim 1, wherein the photoacid generator is represented by Formula 4-2,

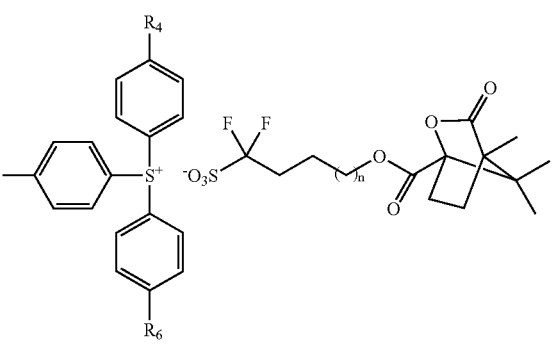

Formula 4-2 wherein $R_4$, $R_5$ and $R_6$ are independently any one of a hydrogen atom and a $C_1$ to $C_5$ alkyl group, a hydroxyl group and a cycloalkyl group, and n is an integer in a range of 1 to 3.

6. The photoresist composition of claim 5, wherein the photoacid generator produces sulfonic acid represented by Formula 3-2, Formula 3-2

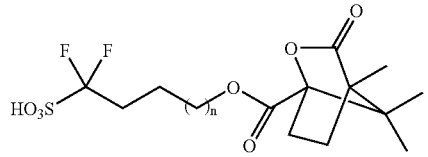

wherein n is an integer in a range of 1 to 3.

7. The photoresist composition of claim 1, wherein the resin comprises an acryl-based resin having a blocking group in a repeating unit, wherein the blocking group includes an adamantly group, a lactone group or a combination thereof.

8. The photoresist composition of claim 1, comprising about 0.15 to about 0.4 percent by weight of the photoacid generator.

9. A method of forming a pattern on a substrate, comprising:

forming a photoresist film on a layer positioned on the substrate by coating the layer with a photoresist composition including about 0.1 to about 0.5 percent by weight of a photoacid generator including a sulfonium ion represented by Formula 1 and a sulfonate ion represented by Formula 2, about 4 to about 10 percent by weight of a resin, and a solvent;

exposing the photoresist film to light in an exposure process;

developing the photoresist film using a developing solution to form a photoresist pattern on the layer; and etching the layer using the photoresist pattern as an etching mask to form the pattern on the substrate, Formula 1

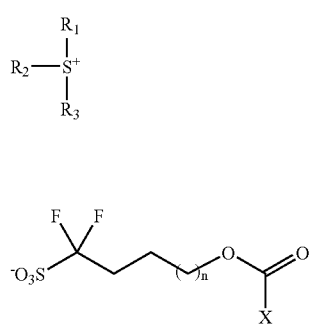

Formula 2 wherein $R_1$, $R_2$ and $R_3$ are independently any one of an aryl group and a cycloalkyl group, n is an integer in a range of 1 to 3, and X is any one of a $C_4$ to $C_8$ cycloalkyl group, an adamantyl group and a cyclic ester moiety.

10. The method of claim 9, wherein the photoacid generator is represented by Formula 4-1, Formula 4-1

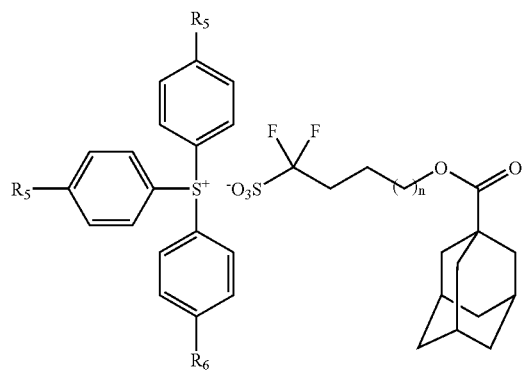

wherein $R_4$, $R_5$ and $R_6$ are independently any one of a hydrogen atom and a $C_1$ to $C_5$ alkyl group, a hydroxyl group and a cycloalkyl group, and n is an integer in a range of 1 to 3.

11. The method of claim 10, wherein the photoacid generator produces sulfonic acid represented by Formula 3-1, Formula 3-1

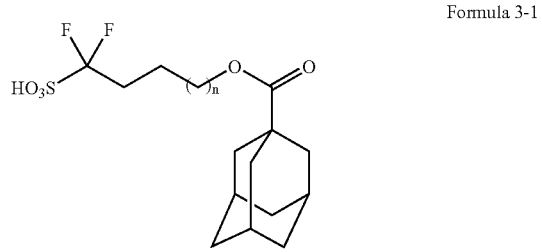

wherein n is an integer in a range of 1 to 3.

12. The method of claim 9, wherein the photoacid generator is represented by Formula 4-2, Formula 4-2

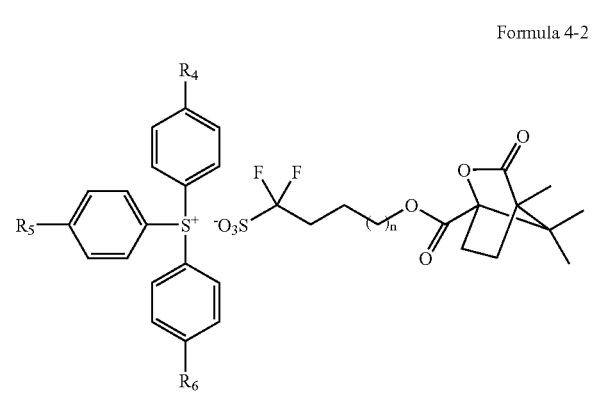

wherein $R_4$, $R_5$ and $R_6$ are independently any one of a hydrogen atom and a $C_1$ to $C_5$ alkyl group, a hydroxyl group and a cycloalkyl group, and n is an integer in a range of 1 to 3.

13. The method of claim 12, wherein the photoacid generator produces sulfonic acid represented by Formula 3-2, Formula 3-2
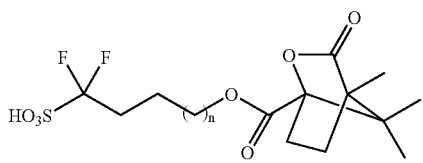
wherein n is an integer in a range of 1 to 3.
14. The method of claim 9, wherein the exposure process is performed using light selected from the group consisting of an $F_2$ laser, an ArF laser, a KrF laser, an X-ray and an ion beam.
15. The photoresist composition of claim 9, comprising about 0.15 to about 0.4 percent by weight of the photoacid generator.
* * * * *